United States Patent [19]

Sorensen et al.

[11] Patent Number: 4,470,043

[45] Date of Patent: Sep. 4, 1984

[54] NON-FADE BOUNCING BALL DISPLAY

[75] Inventors: Jay R. Sorensen, Beaverton; Richard A. Sunderland, Aloha, both of Oreg.

[73] Assignee: Squibb Vitatek Inc., Hillsboro, Oreg.

[21] Appl. No.: 353,537

[22] Filed: Mar. 1, 1982

[51] Int. Cl.³ ............................................. G09G 1/00
[52] U.S. Cl. .................................. 340/722; 340/726; 315/384
[58] Field of Search ............... 340/722, 721, 723, 724, 340/726; 315/384, 385; 128/712, 731–733

[56] References Cited

U.S. PATENT DOCUMENTS

| | | | |
|---|---|---|---|
| 3,406,387 | 10/1968 | Werme | 340/717 |
| 3,653,021 | 3/1972 | Scheer | 340/726 |
| 3,790,851 | 2/1974 | Baring | 340/724 |
| 3,793,626 | 2/1974 | Zambuto | 340/724 |
| 4,094,310 | 6/1978 | McEachern et al. | 315/384 |

Primary Examiner—Marshall M. Curtis
Attorney, Agent, or Firm—Lawrence S. Levinson; Sanford J. Asman

[57] ABSTRACT

A non-fade display for a CRT which includes a brightened dot, or "bouncing ball", is described. The refreshed display makes use of relatively short persistence phosphors, together with a digital controller to momentarily stop a trace at a predetermined point corresponding to the newest data sample point, increase its intensity to form the brightened dot, follow the brightened dot with a blanked zone, and then continue with the older part of the trace.

6 Claims, 2 Drawing Figures

NON-FADE BOUNCING BALL DISPLAY

BACKGROUND OF THE INVENTION

The present invention relates to a display system utilized in conjunction with a cathode ray tube (CRT). In particular, the invention is used in conjunction with CRTs designed to display data including a periodically updated trace.

In various types of apparatus, including oscilloscopes and monitoring devices, such as patient monitors, a CRT is used to display a trace representative of the data being monitored. In a time-variant system, a trace is typically swept across the face of the CRT with new information being presented at the leading edge of the trace. Of particular interest for this invention are displays where the time span of information to be displayed is approximately one second or greater (i.e., where the motion of the beam as it traces out the data to be displayed is clearly discernible by the human eye).

Various display systems have heretofore been used to accomplish this result. In one form of display, for example, new information is written onto the phosphor screen of a CRT in real time by an electron beam, and the screen's phosphor is selected to be one which has a long persistence.

The persistence of a phosphor is its ability to temporarily continue emitting light from those portions of its surface that had been written on by the electron beam, even after that beam no longer strikes it. This light, called "phosphorescence", decays in intensity with time after the electron beam leaves, so that progressively older information is progressively dimmer on the display. At the spot the electron beam strikes the phosphor, its light output, called "fluorescence", is much greater than the phosphorescence of areas of phosphor previously struck.

The decay time of fluorescence is much shorter than the decay time of phosphorescence in a "long persistence" CRT. Because the real-time sweep takes orders of magnitude more time than the decay time of fluorescence, yet is roughly equal to the decay time of phosphorescence, this gives rise to a display where the latest information point in a trace appears as a bright dot or "bouncing ball" followed by a progressively dimmer tail of older information. A problem with such systems is that the data on the screen which is less current rapidly fades from view.

In other existing display systems, data is written into a memory device having memory locations representative of locations on the screen. A memory address pointer is used to indicate the address of the memory locations into which data is written. Since each memory location is associated with a particular screen location, the display circuitry can constantly refresh the screen with data taken from the memory. In this type of display system, the information is constantly being refreshed at a much higher rate than the rate at which new data is being acquired. Hence, CRTs with long persistence phosphors are not required. Typically, the presentation of the data in this type of system is uniformly bright on the CRT screen, because the refresh rate is chosen to be high enough to fool the eye into perceiving it as such. Therefore, in order to distinguish the latest information from older information being presented with equal brightness, the trace immediately to the right of the latest data is blanked, thereby leaving a gap between the newest data and the oldest data on the screen. While this system provides a display with uniform brightness, i.e. a "non-fade" display, the highlighting effect of the bouncing ball is lost.

SUMMARY OF THE INVENTION

The present invention relates to a display system for a CRT which provides both a uniformly bright display and a highlighting bouncing ball.

The display system provides a non-fade bouncing ball display for a CRT display. It comprises a memory unit having discrete memory locations corresponding to locations on the screen of the CRT, the memory unit holding data representative of the location and intensity of a trace to be displayed on the screen of the CRT. It also comprises latch means for receiving and holding data from the memory unit, a controller for loading data into the memory unit and from the memory unit into the latch means, x-axis and y-axis circuitry for directing the electron beam to specific locations on the screen of the CRT as determined by the data in the latch means, and z-axis circuitry for determining the intensity of the electron beam.

A first counter increments during each trace to generate a digital output which is fed into a digital-to-analog converter (DAC). The output of the DAC drives the x-axis, i.e., the horizontal sweep, circuitry which directs the electron beam across the face of the CRT. A second counter is adapted to generate an output signal when the first counter has reached a predetermined count. The controller initializes the second counter with the predetermined count.

A display clock for synchronizing the counting rate of the second counter with the counting rate of the first counter. The display clock also producing a signal which permits the latch means to receive new data from the memory unit. Inhibit means associated with the second counter sends a signal to the display clock for inhibiting the display clock for a predetermined time period, whereby no new data can be entered into the latch means during the predetermined time period. The inhibit means also sends a signal to the z-axis circuitry to increase the electron beam intensity during the predetermined time period, whereby a non-moving, bright dot is formed on the screen during the predetermined time period. A blanking width circuit blanks a portion of the trace immediately after the bright dot by turning off the electron beam while allowing the latch means to continue to receive updated data for a second predetermined time period. Thus, the bright dot is immediately followed by a blanked hole.

DETAILED DESCRIPTION OF THE INVENTION

Figure 1:
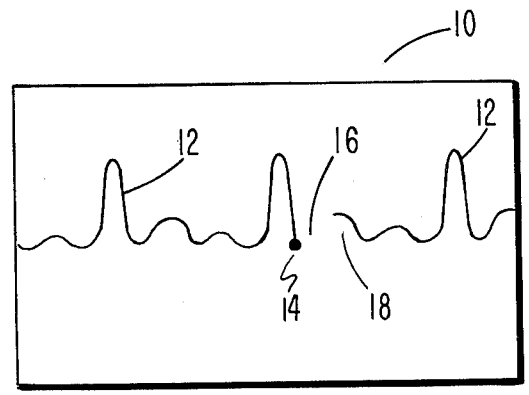
FIG. 1 illustrates a display incorporating the present invention.

Referring generally to FIG. 1, a CRT screen 10 displaying a waveform 12 is illustrated. The most current data is highlighted by a bright spot, or so-called "bouncing ball" 14, which is separated from the oldest data 18 being displayed by a blank area 16. As will be recognized by those of ordinary skill in the art, the bouncing ball 14 is typically scanned across the screen 10 of the CRT, conventionally to the right, as new data is acquired. The blank area 16 is typically scanned across the screen 10 of the CRT to the immediate right of the bouncing ball 14, thereby separating the most current data from the oldest data 18.

Figure 2:
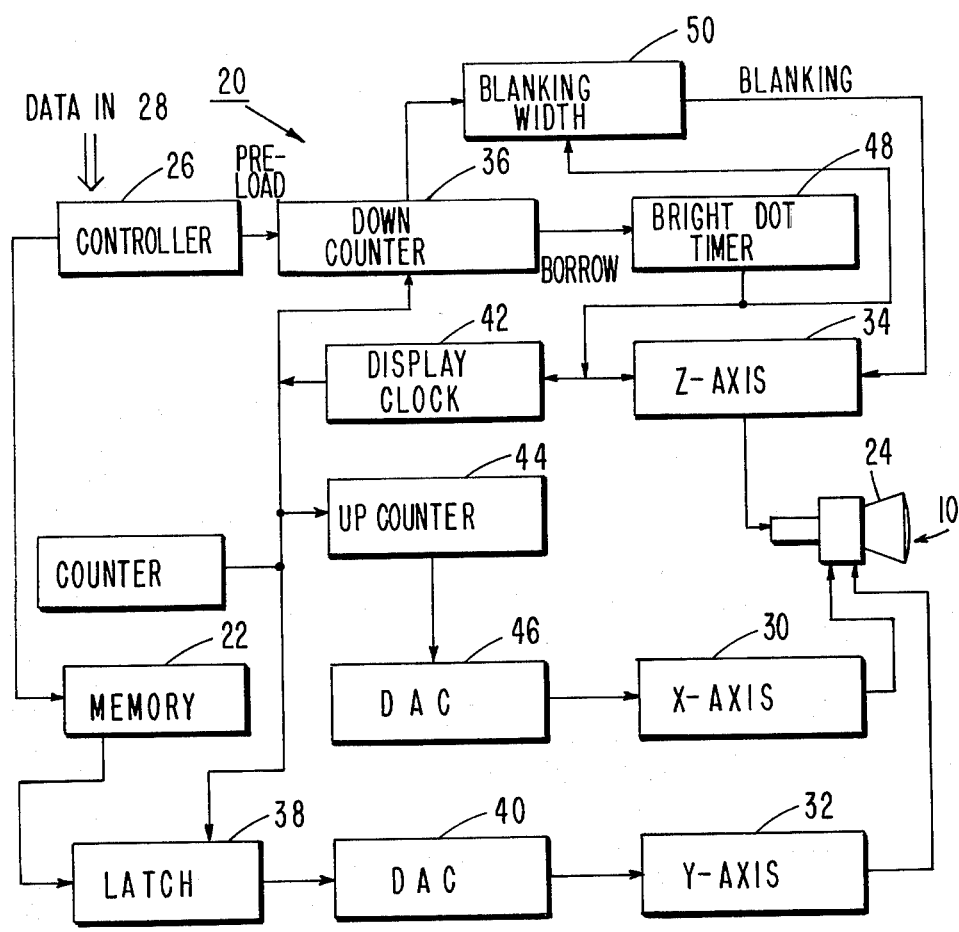
FIG. 2 is a block diagram of the present invention.

Referring now to FIG. 2, a block diagram 20, illustrating the circuitry of the present invention, is shown. In accordance with the block diagram 20, data is entered into a memory unit 22 representing a waveform which is to be displayed on the face of a CRT 24. The data is entered into particular locations in the memory unit 22 by means of a controller 26 which receives the data, typically in digital form, on data lines 28.

In the preferred embodiment of the invention, the memory unit 22 is comprised of semiconductor memory, typically integrated circuit memory chips. Also, a microprocessor is typically used as the controller 26, although other types of controllers can be devised.

In displaying the data from the memory unit 22, x-axis circuitry 30, i.e., horizontal drive circuitry, and y-axis circuitry 32, i.e., vertical drive circuitry, are used in a standard manner, well known in the art, to move an electron beam over the phosphor coated interior surface of the screen of the CRT 24. The intensity of the electron beam is controlled by the z-axis, or drive, circuitry 34.

The bright dot 14 within the trace 12 is obtainable on the screen 10 of the CRT 24 by momentarily increasing the intensity of the electron beam, using the z-axis circuitry 34. However, to obtain a brighter dot than the CRT's maximum electron beam current can provide, especially without defocusing, and to insure that the point of interest in the trace remains a point, rather than a line segment between successive points, additional circuit means are required. The additional circuit means causes both axes of deflection to halt at the point to be highlighted, thereby forcing the appropriate spot of phosphor to emit light for a longer time interval, hence giving a greater brightness, when averaged by the eye. Furthermore, halting both axes of deflection at appropriate outputs (i.e., at a single screen location) guarantees that only one sample point will be highlighted.

For ease in explaining the functions handled by the circuit whose block diagram 20 is shown in FIG. 2, assume that the display the circuitry is to produce is a trace that looks like FIG. 1 and that the signal data is already stored in the memory unit 22.

The method of locating the bright dot 14 and the blanked "hole" 16 within the trace 12 is as follows. Assume that counter 44 starts at count 0, corresponding to the left end of the trace, and that counter 44 will reach a count of 99 at the right end of the trace 12. Assume further, that one data sample is displayed per increment of counter 44, and that the bright dot 14 is to be at the location where counter 44 reaches a count of 55. Counter 36 would be loaded by the controller 26 with an initial count of 54.

Once a sweep is started, display clock 42 synchronizes the incrementing of counter 44, the decrementing of counter 36, and the requesting and latching of successive samples of data into latch 38. During the first clock cycle, counter 44 stays at 0, counter 36 stays at 54, and the first data sample is displayed. During the second clock cycle, counter 44 is at 1, counter 36 is at 53, and the second data sample is displayed. After 55 cycles of display clock 42, counter 36 will be at count 0, counter 44 will be at count 54, and 55 samples of data will have been displayed. During the next cycle of display clock 42, counter 36 will underflow to its maximum count, and it will generate a borrow output. Counter 44 will reach count 55, and the proper data sample will be loaded into latch 38.

The borrow output of counter 36 starts the bright dot timer 48 which controls the time interval during which the horizontal and vertical deflection signals are to be held constant. While bright dot timer 48 is running, it boosts the CRT beam current by means of the z-axis circuitry 34, and it prevents the display clock 42 from running. While the display clock 42 is inhibited, no new data samples can be loaded into latch 38, and counter 44 cannot be incremented, so both x-axis and y-axis signals are held constant.

When bright dot timer 48 finishes its timing interval, it releases the inhibit of display clock 42, removes the z-axis boost from the electron beam, and triggers the blanking width circuit 50 to begin blanking the CRT. The blanking width circuit 50 can be either a digital circuit that interacts with counter 36, as shown, to provide a digitally controlled "hole" width, or it can be a one shot multivibrator, which would not require such an interaction with the counter 36. Note that while the beam is blanked, counter 44 is being incremented in the normal manner by display clock 42. When blanking width circuit 50 completes its operation, it turns the beam back on, and the trace 12 continues to completion.

This sequence describes how one cycle of one trace is accomplished. To achieve a refreshed display with new data continually replacing old data, and the bright dot 14 and blanked hole 16 following the update location, requires action from the controller 26. The controller 26 must load the proper count into counter 36 at the start of each sweep to make the bright dot 14 and hole 16 locations come out properly. The controller 26 must, therefore, always know what count to load. It always has this information, because it has stored the most recent data point, and it knows at what screen location the data will appear.

As will be understood by those skilled in the art, the concept of the present invention may be expanded to include the display of multiple waveforms without departing from the spirit or scope of the present invention.

I claim:

1. A system for providing a non-fade bouncing ball display for a CRT display system comprising:
   (a) a memory unit having discrete memory locations corresponding to locations on the screen of said CRT, said memory unit holding data representative of the location and intensity of a trace to be displayed on the screen of said CRT;
   (b) means for entering data, representative of a waveform which is to be displayed, into said memory locations;
   (c) latch means for receiving and holding data from said memory unit;
   (d) a controller for loading data into said memory unit and from said memory unit into said latch means;
   (e) x-axis and y-axis circuitry for directing the electron beam to specific locations on the screen of said CRT as determined by the data in said latch means;
   (f) z-axis circuitry for determining the intensity of said electron beam;
   (g) a first counter which directs said x-axis circuitry during each trace of said electron beam across the face of said CRT;
   (h) a second counter which is adapted to generate an output signal when said first counter has reached a predetermined count, said controller setting said second counter with said predetermined count;

(i) a display clock coupled to said first counter and said second counter for synchronizing the counting rate of said second counter with the counting rate of said first counter, said display clock also producing a signal which permits said latch means to receive new data from said memory unit;

(j) inhibit means associated with said second counter for sending a signal to said display clock for inhibiting said display clock for a predetermined time period, whereby no further data from said memory unit can be entered into said latch means during said predetermined time period, said inhibit means also sending a signal to said z-axis circuitry to increase said beam intensity during said predetermined time period, whereby a bright dot will be formed on said screen during said predetermined time period; and (k) blanking width circuit means for turning off said electron beam while allowing said latch means to receive updated data from said memory unit for a second predetermined time period, whereby a display frame will be formed on said CRT having a bright dot followed by a blanked hole and whereby successive ones of said frame will appear to an observer to have a moving bright dot which follows a blanked hole.

2. The system of claim 1 wherein said memory unit is a semiconductor memory unit comprised of integrated circuits.

3. The display of claim 2 wherein said controller is comprised of a microprocessor.

4. The display of claim 1 wherein said CRT uses phosphors having a relatively short persistence.

5. The display of claim 4 wherein said blanking width circuit is a digital circuit.

6. The display of claim 4 wherein said blanking width circuit is a one-shot multivibrator.

* * * * *